US 6,538,440 B2

(12) United States Patent
Dean et al.

(10) Patent No.: US 6,538,440 B2
(45) Date of Patent: Mar. 25, 2003

(54) NON-CONDUCTIVE LONG WAVE THERMAL RADIATION SHIELD

(75) Inventors: David Edwards Dean, Hartland, WI (US); Daniel Joseph Weyers, Wauwatosa, WI (US)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 0 days.

(21) Appl. No.: 09/681,887

(22) Filed: Jun. 20, 2001

(65) Prior Publication Data

US 2002/0196020 A1 Dec. 26, 2002

(51) Int. Cl.⁷ .................................. G01V 3/00
(52) U.S. Cl. .................. 324/318; 324/309; 324/319
(58) Field of Search .................. 324/318, 322, 324/311, 307, 319; 62/6; 60/520

(56) References Cited

U.S. PATENT DOCUMENTS 4,587,492 A * 5/1986 Laudermilch ............... 324/318
4,606,194 A * 8/1986 Pirtle et al. ................. 62/6
5,159,929 A * 11/1992 Morris et al. ............ 128/653.2
5,304,932 A 4/1994 Carlson ...................... 324/318
5,349,297 A 9/1994 DeMeester et al. ......... 324/318
6,211,675 B1 4/2001 Ganin et al. ............... 324/318

FOREIGN PATENT DOCUMENTS

JP 2000-081472 * 3/2000 ........... G01R/33/31

* cited by examiner

Primary Examiner—Edward Lefkowitz
Assistant Examiner—Brij B. Shrivastav

(57) ABSTRACT

A thermal radiation shield 44 and a method for applying the same includes a first coating layer 46, a second coating layer 48, and a thermal shield layer 50. The first coating layer 46 is applied to a first surface. The second coating layer 48 is applied to a second service. The thermal shield layer 50 is positioned between the first coating layer 46 and the second coating layer 48 to form the thermal radiation shield 44. The thermal radiation shield 44 has non-interfering electrical properties.

15 Claims, 2 Drawing Sheets

NON-CONDUCTIVE LONG WAVE THERMAL RADIATION SHIELD

BACKGROUND OF INVENTION

The present invention relates generally to a thermal radiation shield particularly suited for a Magnetic Resonance Imager (MRI) System and more particularly, to a method and apparatus for shielding radiation heat transfer between a radio frequency (RF) shield and a patient bore former.

Currently, Magnetic Resonance Imager (MRI) systems have included a superconducting magnet that generates a temporally constant primary magnetic field. The superconducting magnet is used in conjunction with a magnetic gradient coil assembly, which is sequentially pulsed, to create a sequence of controlled gradients in the static magnetic field during a MRI data gathering sequence. The controlled gradients are effectuated throughout a patient imaging volume (patient bore) which is coupled to at least one MRI (RF) coil or antennae. The RF coils are located between the magnetic gradient coil assembly and the patient bore.

As a part of a typical MRI, RF signals of suitable frequencies are transmitted into the patient bore. Nuclear magnetic resonance (nMR) responsive RF signals are received from the patient bore via the RF coils. Information encoded within the frequency and phase parameters of the received RF signals, by the use of a RF circuit, is processed to form visual images. These visual images correspond to the distribution of nMR nuclei within a cross-section or volume of the patient within the patient bore.

Current MRI systems require higher magnetic gradient coil assembly temperatures due to high power densities. Modern MRI systems also have decreased the amount of space between the magnetic gradient coil assembly and the outer surface of the patient bore, thereby, eliminating the potential for active cooling in the patient bore. Therefore, a passive cooling method is needed to reduce heat transfer from the magnetic gradient coil assembly to the RF coils and patient bore. A thermal radiation shield is a passive cooling method that has been used in other areas of industry, separate from MRI systems, to reduce heat transfer.

Thermal radiation shields with infrared properties are known, in the art, to greatly decrease the amount of heat transfer. In the past, thermal radiation shields have possessed infrared reflective properties due to their metalized coatings. The metalized coatings cause the shields to be electrically conductive.

If an electrically conductive shield were used between the RF coil and the magnetic gradient coil assembly it may degrade the resonant electrical properties of the RF circuit and possibly the fidelity of the nMR signal. An electrically conductive shield may also cause the production of detrimental eddy currents. As eddy currents produce their own magnetic fields, the magnetic fields produced by these eddy currents can cause interference with the MRI imaging process.

If an infrared reflective shield were used between the RF coil and the RF shield it may cause interference with the RF wavelengths of interest during MRI operation. The interference with the RF wavelengths of interest may cause MRI imaging problems.

In combination with the aforesaid, MRI systems that comprise a metallic outer surface of the patient bore may also have RF interference with the nMR signals caused by these metallic surfaces.

It would therefore be desirable to provide a method to reduce the heat transfer from the gradient coil to the patient bore and RF coils without degradation of nMR signals in current MRI systems.

SUMMARY OF INVENTION

It is therefore an object of the present invention is to reduce the amount of radiation heat transfer between an outer surface of a patient bore and an inner surface of a magnetic gradient coil assembly of a magnetic resonance imager (MRI) system and not interfere with the transferred RF wavelengths of interest during MRI operation.

Another aspect of the invention is to accomplish the aforesaid and at the same time satisfy space constraints.

In one aspect of the present invention, a thermal radiation shield is provided. The thermal radiation shield comprises a first coating layer and a second coating layer. A thermal shield layer is disposed between the first coating layer and the second coating layer. The thermal radiation shield has non-interfering electrical properties.

In accordance with the above and other objects, a method of applying a thermal radiation shield between a first surface and a second surface is provided. The method of applying the thermal radiation shield includes applying a first coating layer to the first surface. A second coating layer is then applied to the second surface. A thermal shield layer is then positioned between the first coating layer and the second coating layer.

Still another advantage of the present invention, is that it provides versatility allowing it to be applied to various MRI systems with varying space considerations. Another advantage of the present invention, is that higher magnetic gradient coil assembly temperatures of modern MRI systems are no longer a concern due to the infrared reflective and thermal properties of the present invention.

In addition, the present invention prevents degradation of RF electrical characteristics without generating spurious nMR signals. Therefore an infrared reflective thermal radiation shield with non-interfering electrical properties is possible due to the stated advantages.

The present invention itself, together with further objects and attendant advantages, is best understood by reference to the following detailed description, taken in conjunction with the accompanying drawing.

BRIEF DESCRIPTION OF DRAWINGS

For a more complete understanding of this invention reference should now be had to the embodiments illustrated in greater detail in the accompanying figures and described below by way of example.

In the figures.

DETAILED DESCRIPTION

The present invention is described herein with respect to an apparatus and a manufacturing method for producing a thermal radiation shield. However, it will be understood that the following is capable of being adapted for various purposes and is not limited to the following applications; namely magnetic resonance imager (MRI) systems, magnetic resonance spectroscopy systems, and other applications that require radio frequency (RF) fields or gradient magnetic fields.

Figure 1:
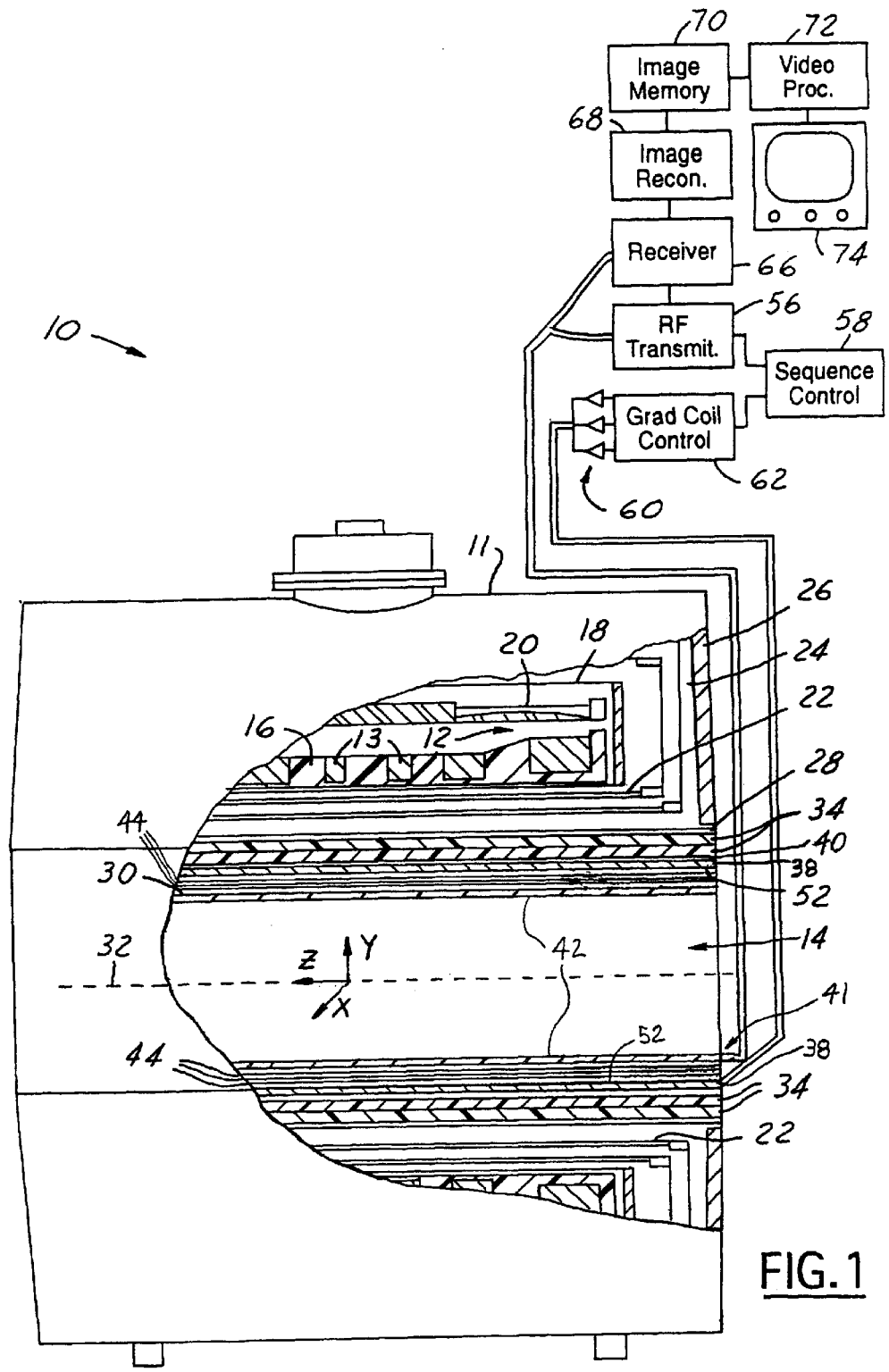
FIG. 1 is a block diagamatic view of a magnetic resonance imager (MRI) system, utilizing a thermal radiation shield applied in accordance with a preferred embodiment of the present invention.

Referring now to FIG. 1, which illustrates a block diagamatic view of a MRI system 10. The MRI system 10 includes a static magnet structure 11 (a cylindrical structure) including a superconducting magnet 12 having a plurality of superconducting magnetic coils 13, which generate a temporally constant magnetic field along a longitudinal axis (z-axis) of a central bore 14 (patient bore). The superconducting magnet coils 13 are supported by a superconducting magnet support structure former 16 and received in a toroidal helium vessel 18. A main magnetic field shield coil assembly 20 generates a magnetic field that opposes the field generated by the superconducting magnet coils 13. A first thermal shield 22 surrounds a helium vessel 26 to reduce boil-off. A second thermal shield 24 may surround the first thermal shield 22. Both the first thermal shield 22 and the second thermal shield 24 are preferably cooled by mechanical refrigeration.

A toroidal vacuum vessel 26 encases the first thermal shield 22 and the second thermal shield 24. The toroidal vacuum vessel 26 comprises a cylindrical member 28 that surrounds the patient bore 14 and extends parallel to a longitudinal axis. On a first exterior side 30, which is a longitudinal side farthest away from the center 32, of the patient bore 14 is a magnetic gradient coil assembly 34. On a second exterior side 36 of the magnetic gradient coil assembly 34 is a cylindrical dielectric former 38. A RF shield 40 is applied to the cylindrical dielectric former 38 or buried within the magnetic gradient coil assembly 34. A RF coil assembly 41 including a primary RF coil 42 and the RF shield 40 is positioned in the patient bore 14.

A non-electrically conductive thermal radiation shield 44 (NTRS) is disposed between the RF shield 40 and the primary RF coil 42. The NTRS 44 comprises a first coating layer 46, a second coating layer 48, and a plurality of thermal layers 50. The plurality of thermal layers 50 are disposed between the first coating layer 46 and the second coating layer 48. The first coating layer 46 is applied to the interior side 52, which is longitudinal side closest to the center 32, of the combined magnetic gradient coil assembly 34 and RF shield 40. The second coating layer 48 is applied to the first exterior side 30 of the patient bore 14.

The primary RF coil 42 is connected to a RF transmitter 56, which is connected to a sequence controller 58. The sequence controller 58 controls a series of current pulse generators 60 via a gradient coil controller 62 that is connected to the magnetic gradient coil assembly 34. The RF transmitter 56 in conjunction with the sequence controller 58 generates pulses of radio frequency signals for exciting and manipulating magnetic resonance in selected dipoles of a portion of the subject within the patient bore 14.

A radio frequency receiver 66 is connected with the primary RF coil 42 for demodulating magnetic resonance signals emanating from an examined portion of the subject. Radio frequency receiver 66 is connected to an image reconstruction apparatus 68 which reconstructs the received magnetic resonance signals into an electronic image representation that is stored in an image memory 70. The stored electronic images in the image memory 70 are converted by a video processor 72 into an appropriate format for display on a video monitor 74.

Figure 2:
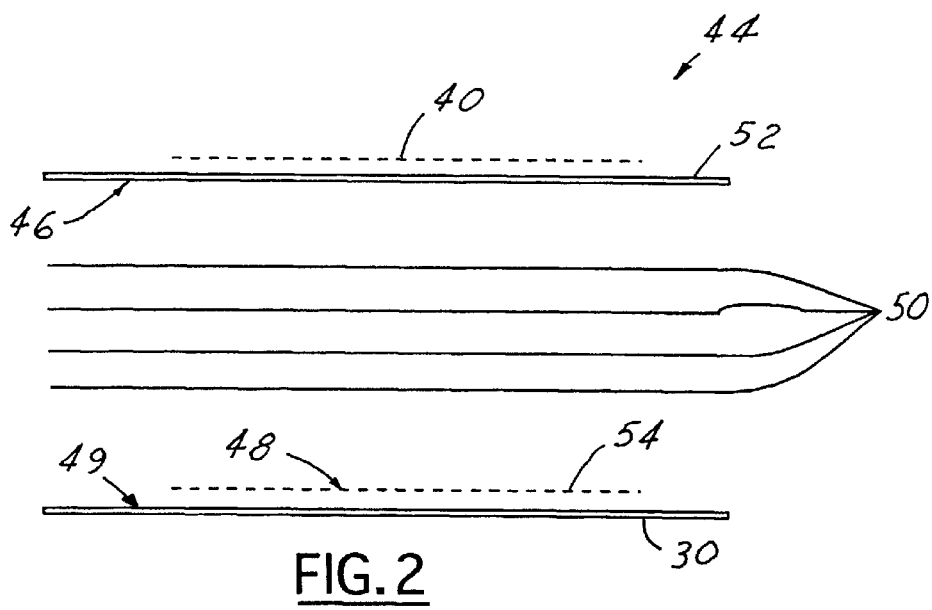
FIG. 2 is an enlarged, detailed cross-sectional view of a MRI system in accordance with a preferred embodiment of the present invention.

Referring now to FIG. 2, which illustrates an enlarged detailed cross-sectional view of the NTRS having the first coating layer 46, the second coating layer 48, and the plurality of thermal layers 50. The first coating layer 46 and the second coating layer 48 may comprise various composite materials and are not limited to the composite materials stated in the following embodiments.

The first coating layer 46 and the second coating layer 48 are preferably comprised of a paint containing metallic powder. The paint may be of any style commercially available that is capable of reflecting broadband infrared energy. Of course, layer 46 and layer 48 may comprise a coating material other than paint, such as stain, acrylic, or other material. The electrical resistance of the resulting composite of metallic powder and paint should be sufficiently high in order to prevent any noticeable current when the MRI system is operated. The electrical resistance of the resulting composite of metallic powder and paint for the present invention approaches infinity. The composite powder and paint reflects undesired infrared signals.

In accordance with another embodiment, a pattern of metal traces is used for both layer 46 and layer 48. The application of the pattern of metal traces to the interior side 52 and the first exterior side 30 form the first coating layer 46 and the second coating layer 48 respectively. The pattern of metal traces and the method of applying the same in combination with the thickness of layer 46 and layer 48 is sufficient to prevent the generation of detrimental eddy currents. The pattern of metal traces is sufficient for infrared reflective surface properties and at the same time contains sufficient openings for undisturbed passage of desired RF signals.

In yet another embodiment of the present invention, multiple layers of thin non-metallic films are used to form the first coating layer 46 and the second coating layer 48. The application of layer 46 and layer 48 may be performed using any conventional method known in the art. The RF properties of the multiple layers of thin non-metallic films reflect off infrared energy within desired predetermined target wavebands. The thin non-metallic films are manufactured from a dielectric material.

Alternate embodiments of the present invention may also be employed wherein the use of coatings on the inner and outer surfaces may be eliminated.

The thermal layers of the NTRS are placed between the first coating layer 46 and the second coating layer 48. The quantity and thickness of the thermal layers 50 depends on the particular space constraints of the MRI system. The thermal layers 50 comprise non-metallic, infrared reflective but non-electrically conductive materials that do not effect the nMR signals. The present invention uses a thin substrate polyester material in combination with paint to form the thermal layers 50. An embodiment of the present invention could eliminate any or all of the thermal shield layers positioned between the inner and outer surfaces. Thus numerous combinations of coated surfaces with or without added layers between the surfaces may be employed.

Figure 3:
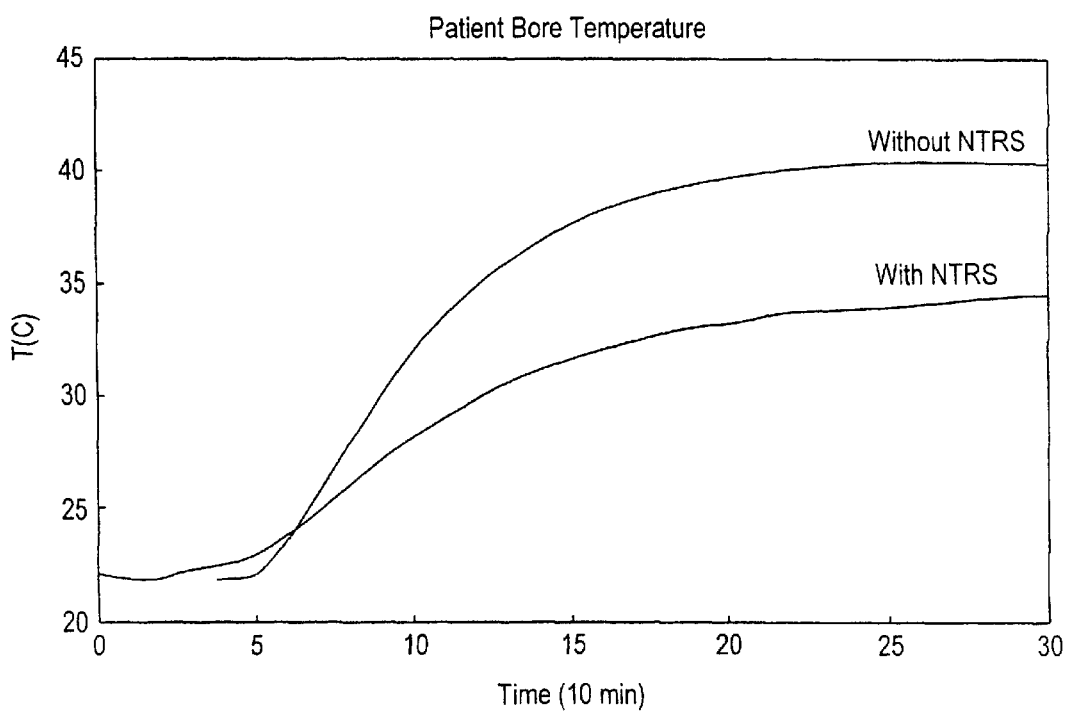
FIG. 3 is a graph of temperature versus time for the MRI system 10 using the NTRS 44 and the MRI system 10 not using the NTRS 44.

Now referring to FIG. 3, a graph of temperature versus time for the MRI system 10 using the NTRS 44 and the MRI system 10 not using the NTRS 44 is shown. Over time, temperature is less in the MRI system 10 when using the NTRS 44.

The above-described invention helps minimize the problems caused by higher magnetic gradient coil temperatures and satisfies space constraints of various MRI applications.

The above-described apparatus and manufacturing method, to one skilled in the art, is capable of being adapted for various purposes and is not limited to the following applications: MRI systems, magnetic resonance spectroscopy systems, and other applications that require RF fields or gradient magnetic fields and may be used with a variety of other applications. The above-described invention can also be varied without deviating from the true scope of the invention.

What is claimed is:

1. A thermal radiation shield for a magnetic resonance imager system comprising:
   a first coating layer;
   a second coating layer;
   a thermal shield layer disposed between said first coating layer and said second coating layer;
   wherein the thermal radiation shield has non-interfering electrical properties.

2. A system as claimed in claim 1 wherein said first coating layer or said second coating layer comprises paint.

3. A system as claimed in claim 1 wherein said first coating layer or said second coating layer is infrared reflective.

4. A system as claimed in claim 1 wherein said first coating layer or said second coating layer contains metallic powder.

5. A system as claimed in claim 1 wherein said first coating layer or said second coating layer comprises a pattern of metal traces.

6. A system as claimed in claim 1 wherein said first coating layer or said second coating layer comprises a plurality of non-metallic film layers.

7. A system as claimed in claim 1 wherein said thermal shield layer comprises a plurality of thermal layers.

8. A magnetic resonance imager (MRI system comprising:
   a radio frequency (RF) coil;
   a magnetic gradient coil assembly; and
   a thermal radiation shield including a plurality of layers disposed between said RF coil and said magnetic gradient coil assembly;
   wherein said thermal radiation shield has non-interfering electrical properties.

9. A system as claimed in claim 8 wherein said thermal radiation shield comprises:
   a first coating layer;
   a second coating layer; and
   a thermal shield layer disposed between said first coating layer and said second coating layer.

10. A system as claimed in claim 9 wherein said first coating layer or said second coating layer comprises paint.

11. A system as claimed in claim 9 wherein said first coating layer or said second coating layer is infrared reflective.

12. A system as claimed in claim 9 wherein said first coating layer or said second coating layer contains metallic powder.

13. A system as claimed in claim 9 wherein said first coating layer or said second coating layer comprises a pattern of metal traces.

14. A system as claimed in claim 9 wherein said first coating layer or said second coating layer comprises a plurality of non-metallic film layers.

15. A system as claimed in claim 9 wherein said thermal shield layer comprises a plurality of thermal layers.

* * * * *